US008374821B2

(12) United States Patent
Rousselle et al.

(10) Patent No.: US 8,374,821 B2
(45) Date of Patent: *Feb. 12, 2013

(54) THERMAL POWERLINE RATING AND CLEARANCE ANALYSIS USING THERMAL IMAGING TECHNOLOGY

(75) Inventors: Adam Robert Rousselle, New Hope, PA (US); Vesa Johannes Lepppanen, Doylestown, PA (US); Kevin Brzys, Stowe, VT (US); Hugh Andrew Clymer, Stowe, VT (US); Dawn Marie Smith, Stowe, VT (US)

(73) Assignee: Utility Risk Management Corporation, LLC, Stowe, VT (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/212,684

(22) Filed: Aug. 18, 2011

(65) Prior Publication Data

US 2012/0019622 A1 Jan. 26, 2012

Related U.S. Application Data

(60) Provisional application No. 61/426,037, filed on Dec. 22, 2010, provisional application No. 61/448,236, filed on Mar. 2, 2011, provisional application No. 61/495,694, filed on Jun. 10, 2011.

(51) Int. Cl.
*G01K 17/02* (2006.01)
*G01K 17/06* (2006.01)
*G01K 17/14* (2006.01)
*G01C 5/02* (2006.01)

(52) U.S. Cl. ......... 702/130; 702/134; 702/136; 702/152
(58) Field of Classification Search .................. 702/19, 702/45, 50, 130, 157, 158, 188; 250/383.3; 315/297; 382/154; 706/54
See application file for complete search history.

(56) References Cited

U.S. PATENT DOCUMENTS

| 4,268,818 | A | 5/1981 | Davis et al. |
| 4,384,289 | A | 5/1983 | Stillwell et al. |
| 4,635,055 | A | 1/1987 | Fernandes et al. |
| 4,728,887 | A | 3/1988 | Davis |
| 4,818,990 | A | 4/1989 | Fernandes |
| 4,821,138 | A | 4/1989 | Nakano et al. |
| 4,904,996 | A | 2/1990 | Fernandes |
| 5,341,088 | A | 8/1994 | Davis |
| 5,502,307 | A * | 3/1996 | Baliga et al. ............ 250/338.3 |
| 6,776,522 | B2 | 8/2004 | Syracuse et al. |
| 6,853,327 | B2 | 2/2005 | Miceli et al. |
| 7,046,841 | B1 * | 5/2006 | Dow et al. ................ 382/154 |
| 7,369,045 | B2 | 5/2008 | Hansen |
| 7,575,371 | B1 | 8/2009 | Yakymyshyn et al. |
| 8,275,570 | B2 * | 9/2012 | Rousselle ................ 702/130 |
| 2004/0105635 | A1 | 6/2004 | Nandi et al. |
| 2009/0267540 | A1 * | 10/2009 | Chemel et al. ............ 315/297 |
| 2010/0017153 | A1 | 1/2010 | Strehl |

(Continued)

OTHER PUBLICATIONS

"Temperature Measurement on Overhead Transmission Lines (OHTL) Utilizing Surface Acoustic Wave (SAW) Sensors", CIRED, 19th International Conference on Electricity Distribution, Vienna, May 21-24, 2007, pp. 1-4.

(Continued)

*Primary Examiner* — Michael Nghiem
*Assistant Examiner* — Felix Suarez
(74) *Attorney, Agent, or Firm* — Pepper Hamilton LLP

(57) ABSTRACT

A method and apparatus are provided to acquire direct thermal measurements, for example, from a LiDAR collecting vehicle or air vessel, of an overhead electrical conductor substantially simultaneous with collection of 3-dimensional location data of the conductor, and utilize temperature information derived from the direct thermal measurements in line modeling, line rating, thermal line analysis, clearance analysis, and/or vegetation management.

21 Claims, 7 Drawing Sheets

U.S. PATENT DOCUMENTS

2010/0076719 A1    3/2010  Lawry et al.
2010/0198775 A1*   8/2010  Rousselle et al. ............... 706/54

OTHER PUBLICATIONS

"Saw sensors—Wireless Temperature Measurement", http://enbw.com/content/en/group/innovations/energy_transmission_in_the_network, 2011.

"Overhead Powerline—Strain & Temperature Monitoring" http://www.sensornet.co.uk/news/case-studies/overhead-powerline—strain-temperature, 2011, pp. 1-3.

"Real Time Monitoring of Power Cables by Fibre Optic Technologies Tests, Applications and Outlook", JICABLE, Jun. 22-26, 2003—International Conference on Insulated Power Cables, Paris, France, pp. 1-7.

"Power Donut2 System for Overhead Transmission Line Monitoring", USi Real-time Answers/Integrated Solutions, Armonk, NY, Oct. 2006, pp. 1-17.

"Emissivity of aluminium and its importance for radiometric measurement", J. Bartl, M. Baranek, Measurement Science Review, vol. 4, Section 3, 2004, pp. 31-36.

"LIDAR Imaging Takes Flight in Canada", Utility Automation & Engineering T&D Magazine, Dec. 2007, pp. 1-6.

"Combined distributed temperature sensing and current monitoring", Sebastian Kramer, et al., Fiber Optic Sensors and Applications V, Proc of SPIE, vol. 6770, (2007), pp. 677015-1-677015-9.

"Principles of Infrared Thermometry", W.R. Barron, Williamson Corporation, Sensors, Dec. 10-19, 1992, pp. Z-59-Z62.

"Optical Properties of Aluminum Oxide: Determined from Vacuum Ultraviolet and Electron Energy-Loss Spectrosopies", Roger H. French, et al., J. Am. Ceram. Soc. 81(10), 1998, pp. 2549-2557.

"Matisse: Advanced Earth Modeling for Imaging and Scene Simulation", Pierre Simoneau, et al. Proc. SPIE 4538, 39 (2002); Sep. 2001, pp. 1-10.

"Overview of Powerlines Extraction and Surveillance Using Remote Sensing Technology", Chao Mu, et al., Proc. of SPIE vol. 7498, 2009, pp. 74981M-1-74981M-8.

"Optimize Capacity of Overhead Lines by Conductor Surface Test", Ray Ferraro, Electric Energy Online.com, 2010, pp. 1-4.

"Atmospheric Corrections of Low Altitude Thermal Infrared Airborne Images Acquired Over a Tropical Cropped Area", V. Lebourgeois, et al., IEEE International Geoscience & Remote Sensing Symposium, Boston, (2008), pp. 1-4.

"Airborn Thermal Infrared Remote Sensing Palouse River Basin, WA/ID", Watershed Sciences, Inc., May 2006, pp. i-28.

"Wireless Transmission Line Thermometer", Eknath Vittal, et al. Dec. 2005, pp. 1-23.

"Populating a GIS of Utility Corridor Assets Using an Integrated Airborne Data Acquisition System", Richard Vann, ESRI User Conference, 2000, pp. 1-8.

Lu et al., "Accuracy of Transmission Line Modeling Based on Aerial LiDAR Survey," IEE Transactions on Power Delivery, IEEE Service Center, New York, NY, vol. 23, No. 3, Jul. 2008, pp. 1655-1663.

Stahlhut et al., "Innovative Sensory Concepts for Power Systems," Power Symposium, North American, IEEE, PI, Sep. 1, 2006, pp. 397-404.

Huang et al., "New Type of Fiber Optic Sensor Network for Smart Grid Interface of Transmission Systems," Power and Energy Society General Meeting, 2010 IEEE, IEEE, Piscataway, New Jersey, Jul. 25, 2010, pp. 1-5.

Hooper B., "Vegetation Management Takes to the Air," Transmission & Distribution World Intertec Publishing USA, vol. 55, No. 9, Sep. 2003.

* cited by examiner

THERMAL POWERLINE RATING AND CLEARANCE ANALYSIS USING THERMAL IMAGING TECHNOLOGY

CROSS REFERENCE TO RELATED APPLICATIONS

This application is related to commonly assigned, concurrently filed application Ser. No. 13/212,689, now U.S. Pat. No. 8,275,570, filed Aug. 18, 2011, and claims priority of U.S. provisional application Ser. No. 61/426,037 filed on Dec. 22, 2010, Ser. No. 61/448,236 filed on Mar. 2, 2011, and Ser. No. 61/495,694 filed on Jun. 10, 2011, the entire contents of these applications being hereby incorporated by reference herein.

BACKGROUND ART

Background

This invention relates generally to the field of powerline management, and, more particularly to a new approach that directly determines temperature of an overhead electrical conductor at time of 3-dimensional location data collection, for use in such applications as CAD modeling of the conductor, thermal line analysis of the conductor, thermal rating of a power line that includes the conductor, clearance analysis relative to the conductor, vegetation management relative to the conductor, and/or other applications especially useful to electric utilities in safeguarding and optimizing their transmission and distribution infrastructure.

LiDAR (Light Detection And Ranging) is used to produce CAD (Computer Assisted Design) models of powerlines. In the process known to industry, LiDAR data is collected using a sensor that is mounted to an aerial platform, tripod or a land vehicle. For clearance analysis during different conductor conditions, it is important to know the temperature at the time the LiDAR data was collected. In the process known to industry, LiDAR data is captured simultaneously with weather and line loading data that allows modeling of the conductor temperature.

The process of predicting conductor temperature at time of LiDAR data collection using loading and weather data requires accurate knowledge of weather conditions at the right-of-way. Especially, prediction of wind speed and direction are difficult to perform due to turbulence and high variation of wind speeds. Weather stations have to be employed to acquire the weather information.

The U.S. government is currently mandating modernization of the nation's electrical grid in order to enhance national security. As part of this effort, the North American Electric Reliability Corporation (NERC)—certified by the Federal Energy Regulatory Commission to develop and enforce reliability standards for the electric grid in North America—on Oct. 7, 2010 issued a regulatory alert requiring all transmission line operators to assess within the next three years the precise physical characteristics of their high voltage transmission lines relative to design specifications. NERC recommended that utilities use PLS-CADD (engineering software that determines what the wire's physical properties are and where the conductor is located under given conditions, based on temperature and conductor type inputs) to comply with this requirement. The actual conductor temperature will be a leading indicator for NERC.

Current industry practice calculates—rather than measures—the temperature of a bare conductor, utilizing factors such as ambient weather conditions, physical and thermal properties of the conductor, and line loading information. Due primarily to weather variables, this practice can generate a significant margin of error. The associated uncertainty of a conductor's temperature directly limits its capacity.

The power conductors of overhead transmission lines are self-supporting and energized at high voltage. As current flow through conductors increases, the temperature of the conductors increases, causing them to elongate. This elongation increases the sag of the conductors between support points, decreasing the clearance between the conductors and people, the ground, vegetation, buildings, vehicles and other objects under the lines. Beyond certain "maximum allowable" sag, the lines may flashover, resulting in a power supply outage or injury to the public or property damage. Additionally, if conductor temperature remains high for an extended period of time, the strength of the conductors and tensioned connectors may decrease, which could trigger mechanical failure during the next occurrence of ice or high wind loading. To avoid excessive sag or loss of strength, limits are placed on maximum operating temperature of the conductor.

SUMMARY

Direct contemporaneous thermal measurements, e.g. from the LiDAR-collecting vehicle or air vessel, would bypass many of the current constraints. Accordingly, a method is presented to acquire direct thermal measurements, for example, from the LiDAR collecting vehicle or air vessel, of the conductor substantially simultaneous with collection of 3-dimensional location data of the conductor, and utilize temperature information derived from the direct thermal measurements in line modeling, line rating, thermal line analysis, clearance analysis, and vegetation management.

According to the present invention, a method is provided for thermal line analysis of an overhead electrical conductor, comprising: collecting 3-dimensional location data of the conductor; substantially simultaneous with said collecting, acquiring a thermal measurement of the conductor; generating a CAD model of the conductor using the collected 3-dimensional location data of the conductor and the thermal measurement of the conductor, and employing the CAD model for thermal line analysis of the conductor.

The thermal measurement may comprise a remotely collected thermal image. The remotely collected thermal image may comprise thermal image frames, and the method may further comprise: selecting, for processing, frames of said thermal image frames that meet the following criteria: contain the conductor, contain a background having lower thermal values than the conductor, and exhibit image quality that allows accurate thermal reading. The selecting may involve automatic thermal image filtering, including at least one of: discarding image frames that have an image sharpness index below a given threshold, discarding image frames that have a background thermal emission higher than a thermal emission of the conductor, and selecting only image frames that contain the conductor.

The method for thermal line analysis may further include linking a selected image frame to a geographic location, by, for example, geocoding the selected frame to attribute a spatial reference and image resolution parameters to the selected frame. Other known techniques for linking image frames to geographic location may also be employed.

The method for thermal line analysis may further include extracting a thermal reading from the geographically linked selected frame, and determining emitted energy from the conductor employing the extracted thermal reading.

When remote collection of the thermal image employs a thermal camera system, the method may further comprise radiometrically calibrating the thermal camera system to cover an expected operational temperature range of the conductor.

In the method for thermal line analysis, acquiring the thermal measurement of the conductor substantially simultaneous with the collecting of the 3-dimensional location data may comprise acquiring the thermal measurement at the same time that the 3-dimensional location data is collected or within a time period that temperature of the conductor is unlikely to vary, e.g. within fifteen minutes of the collecting of the 3-dimensional location data.

The method for thermal line analysis may further include performing a thermal analysis of the thermal measurement to determine temperature of the conductor at the time of collecting the 3-dimensional location data; generating the CAD model of the conductor using the temperature of the conductor determined by the thermal analysis; and employing the CAD model of the conductor to determine a thermal rating of a target line that includes the conductor and/or to analyze clearance between the conductor and surroundings of the conductor. The clearance analysis may comprise conducting at least one of a sway analysis and a sag analysis to determine conductor location in different weather and/or line loading conditions.

In the method for thermal line analysis, the 3-dimensional location data may comprises LiDAR data collected from an airborne or other vehicle, and the thermal measurement may advantageously be acquired by the vehicle concurrently with the LiDAR data.

A method is also provided for determining temperature of an overhead electrical conductor, comprising: collecting 3-dimensional location data of the conductor; substantially simultaneous with said collecting, acquiring a thermal measurement of the conductor; and performing a thermal analysis of the thermal measurement to determine temperature of the conductor at the time of collecting the 3-dimensional location data. The method may further comprise generating a CAD model of the conductor using the collected 3-dimensional location data of the conductor and the determined temperature of the conductor, and employing the CAD model for at least one of: thermal line analysis of the conductor, thermal rating of a power line that includes the conductor, clearance analysis relative to the conductor, and vegetation management relative to the conductor.

A method is further provided for modeling of an overhead electrical conductor, comprising: collecting 3-dimensional location data of the conductor; substantially simultaneous with said collecting, acquiring a thermal measurement of the conductor; and generating a CAD model of the conductor using the collected 3-dimensional location data of the conductor and the thermal measurement of the conductor.

An apparatus is provided for determining temperature of an overhead electrical conductor, comprising: a thermal sensor that captures thermal images on a sensor cell array; optics that project a thermal image from an imaged object onto the sensor cell array; and a data processor that extracts thermal readings from selected image frames containing the conductor captured by the thermal sensor, and processes the thermal readings and collected 3-dimensional location data of the conductor to determine the temperature of the conductor.

The thermal sensor may comprise an infrared camera, a thermal line scanner, or other thermal measurement device. The apparatus may further include a thermal band filter that minimizes impact of sun reflection from the conductor, and/or a sky thermometer that measures atmospheric temperature in a direction that thermal radiation may be reflected from the conductor towards the thermal sensor, and the data processor may employ the measured atmospheric temperature in determining the temperature of the conductor.

If the thermal sensor and optics are mounted to a vehicle, the apparatus may further include a vibration isolation device that isolates the thermal sensor and the optics from vehicle vibration, or other vibration mitigation device(s) and/or practice(s).

The apparatus may further include a LiDAR sensor or other sensor collecting 3-dimensional location data of the conductor substantially simultaneous with the thermal sensor capturing thermal images of the conductor, and, optionally, a recording positioning device that records thermal sensor location readings for image frames of thermal images captured by the thermal sensor. The data processor may further perform at least one of: thermal modeling of the conductor, thermal line analysis of the conductor, thermal rating of a line containing the conductor, and clearance analysis relative to the conductor, based on the determined temperature of the conductor.

An apparatus is further provided for determining temperature of an overhead electrical conductor, comprising: a location sensor collecting 3-dimensional location data of the conductor; a thermal sensor acquiring a thermal measurement of the conductor substantially simultaneous with said collecting; and a data processor employing the collected 3-dimensional location data of the conductor and the thermal measurement to determine the temperature of the conductor at time of collection of the 3-dimensional location data of the conductor. The location sensor may comprise a LiDAR sensor or other location data collecting sensor, and the thermal sensor may comprise a thermal image capturing device or other thermal measurement device. A recording positioning device that records thermal sensor location readings for image frames of thermal images captured by the thermal sensor may be included in the apparatus.

The data processor of the apparatus may generate a CAD model of the conductor using the 3-dimensional location data of the conductor collected by the location sensor, and the thermal measurement of the conductor acquired by the thermal sensor, and may also perform at least one of: thermal modeling of the conductor, determining thermal rating of a line containing the conductor, thermal line analysis of the conductor, and analyzing clearance between the conductor and surroundings of the conductor, based on the determined temperature.

BRIEF DESCRIPTION OF THE DRAWINGS

Various aspects, features and advantages of the present invention will be apparent from the following detailed description of illustrative embodiments, read in conjunction with the accompanying drawings, in which.

DETAILED DESCRIPTION

Figure 1:
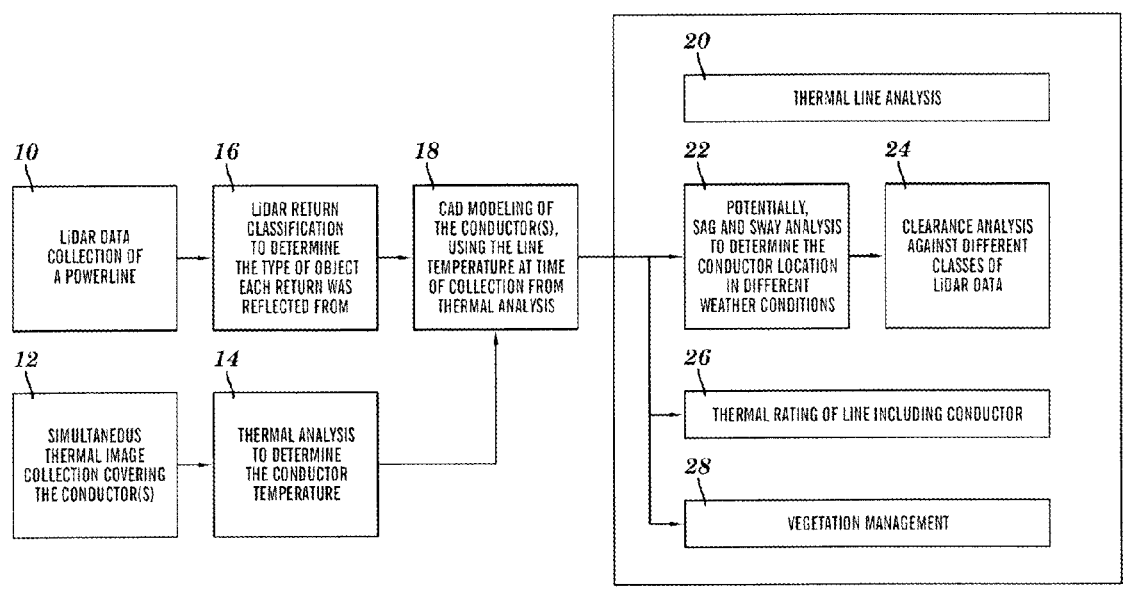
FIG. 1 illustrates an example of a thermal line analysis method using thermal imaging technology.

FIG. 1 provides an overview of a method for thermal line analysis of an overhead electrical conductor in accordance with the principles of the present invention. The method may include the following steps.

LiDAR Data Collection of a Powerline (10)

Collecting LiDAR data over a powerline is a process well known to the industry.

Simultaneous Thermal Image Collection Covering the Conductor(s) (12)

Simultaneous collection of thermal measurements of the conductor temperature may be accomplished according to the process described in detail below.

Thermal Analysis to Determine the Conductor Temperature (14)

Thermal analysis to determine the conductor temperature may be accomplished according to the process described in detail below.

LiDAR Return Classification (16)

LiDAR return classification is a process well known in the industry to determine the type of object each return was reflected from. There are commercial products, for example, TerraScan® software, available from Terrasolid Ltd., Ylistönmäentie 26 A313, Fin 40500 Jyväskylä, Finland and Merrick MARS® software, available from Merrick & Company, 2450 South Peoria Street, Aurora, Colo. 80014, that can be used to classify the returns.

CAD Modeling of the Conductor(s), Using the Line Temperature at Time of Collection from Thermal Analysis (18).

CAD modeling of line conductors itself is a process well known to the industry. For example, commercially available PLS-CADD® software package, available from Power Line Systems, 610 N. Whitney Way, Suite 160, Madison, Wis. 53705, can be used to model line conductors with LiDAR data.

Thermal Line Analysis Employing the Cad Model of the Conductor(s) (20)

In this document, the term "thermal line analysis" connotes analysis that is done using a CAD model of the line, and simulating line conditions under different temperatures of the conductors or other line components. One type of thermal line analysis, known as Survey Point Clearance (SPC) analysis, includes a clearance analysis that checks the required horizontal and vertical clearances of each classified survey point in relation to the displaced conductor. In this document, survey point means a feature in the proximity of the line, that is of interest for line management, and whose location is surveyed. In Survey Point Clearance analysis, the conductor locations are simulated under varying conditions, based on different combinations of wind, ice, and operating temperature and the clearance margin, location, and survey feature type of each point-of-interest is recorded. The final product can be, for example, the identification of survey features that have breached the required clearance distances under client specified conductor conditions. Thermal Line Analysis and Survey Point Clearance analysis can be performed, for example, within commercially available PLS-CADD® software package, available from Power Line Systems, 610 N. Whitney Way, Suite 160, Madison, Wis. 53705.

In Some Embodiments, Either of the Systems May Perform a Sag and Sway Analysis 22 to Determine the Conductor Location in Different Weather Conditions.

Sag and sway analyses are processes well known to the industry. For example, commercially available PLS-CADD® software package, available from Power Line Systems, 610 N. Whitney Way, Suite 160, Madison, Wis. 53705, can be used to perform sag and sway analysis to determine conductor location in different weather conditions. This analysis is not necessary, if the clearances are analyzed as observed-conditions. However, even using as observed-conditions, it is useful to record what the conductor temperature was during analysis.

Clearance Analysis Against Different Classes of LiDAR Data (24)

Clearance analysis is a process well known to the industry. In clearance analysis, the LiDAR returns in one or several classes are selected and smallest distance between the LiDAR return and the target line is calculated. Then, all the points where the distance is less than a given clearance criteria for the given point class are reported. For example, commercially available PLS-CADD® software package, available from Power Line Systems, 610 N. Whitney Way, Suite 160, Madison, Wis. 53705, can be used to perform this task.

Thermal Rating of Line Including Conductor (26)

The Thermal Line Rating (TLR) analysis determines the maximum conductor temperature that can be reached before any required clearance distances are breached. Typically, the conductors are initially placed at 32° F., and then heated to their maximum operating temperature (often 212° F.). At the moment that any clearance distance is breached, the conductor temperature of that span is recorded. The type and location of the corresponding survey feature type may also be recorded. Typically, the final product is the maximum allowable temperature of each circuit's span under the existing as-found conditions. Thermal line rating can be performed, for example, within commercially available PLS-CADD® software package, available from Power Line Systems, 610 N. Whitney Way, Suite 160, Madison, Wis. 53705.

Vegetation Management (28)

Vegetation management consists of all operations undertaken to keep vegetation in proximity of a powerline, substations or other system components in a condition that does not cause harm or risk to the system operation, reliability or safety. Vegetation management can be planned, for example, in commercially available Powel NetBas software, available from Powel, Inc., 930 Blue Gentian Road, Suite 1300, St. Paul, Minn. 55121. Optionally, vegetation management can include also vegetation growth prediction, which is described in commonly assigned U.S. patent application Ser. No. 12/640,951 filed on Dec. 17, 2009, the entire contents of which is hereby incorporated by reference herein.

An illustrative thermal image collection process and apparatus, and a process of thermal analysis to determine conductor temperature will now be described. The example presents a method and apparatus for determining conductor temperature from a vehicle moving or stationary relative to the line. The vehicle can be, for example, a helicopter flying above the lines, a ground vehicle following the line, watercraft or a ground supported stationary mount that is used to mount the thermal sensor. The thermal measurement is acquired substantially simultaneous with line location data collection. Substantially simultaneous means taking the thermal measurements at the same time or within such a small time frame, such as 15 minutes, during which the conductor temperature does not change significantly. A typical way to collect 3-dimensional line location information is with Light Detection and Ranging sensor (LiDAR) from a helicopter, moving above the line. Although LiDAR data collection from a helicopter is used as an example herein, fixed wing aircraft, land vehicles, spacecraft or watercraft can be used to remotely collect LiDAR or other 3-dimensional location data of utility lines. The thermal measurement and analysis can be applied to those cases as well.

Accordingly, a method and apparatus are provided to acquire thermal measurements on overhead transmission and distribution conductors at time of 3-dimensional location data (e.g. airborne LiDAR) data collection, by thermographic imaging or other direct thermal measurement acquisition approaches. The method and apparatus may advantageously be used in overhead utility transmission and distribution power line management and in overhead communication or phone line management.

System Components

Figure 2:
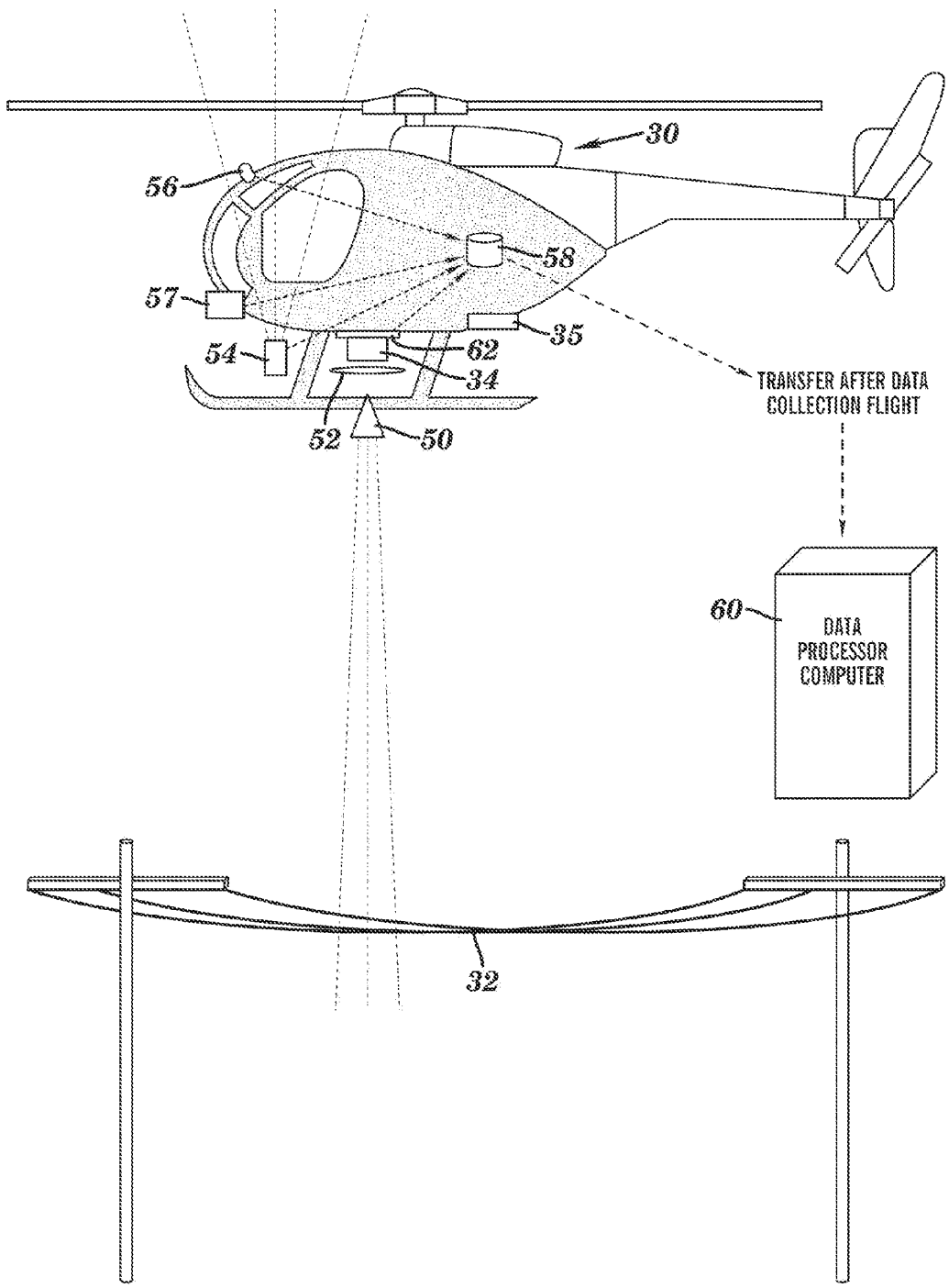
FIG. 2 schematically illustrates an example of apparatus that may be used in implementing the thermal line analysis method.

An illustrative embodiment of the system or apparatus is depicted in FIG. 2 in the context of a helicopter 30 flying above one or more overhead electrical conductors 32 and collecting 3-dimensional location data (e.g. LiDAR data) with a remote location data sensor 35. The collection system may include, for example a main thermal sensor 34, such as an infrared camera that collects and/or measures thermal readings on a sensor cell array. The cell array produces arrays of pixels with thermal readings or thermal images. The sensor cells can be positioned in a scan line as with a line scanner, or as a frame that contains N×M pixels as with a frame camera. The frame camera can be, for example, based on a cooled Indium Antimonide (InSb) detector, with spectral range of 3-5 micrometer, resolution of 640×512 pixels and 15 micrometer detector pitch. Integration times between 0.5-7 microseconds have produced efficient results. FLIR® SC6700 camera available from FLIR Systems Inc. of 25 Esquire Road, North Billerica, Mass. 01862 is an example of a commercial product that can be used. Although the use of a frame camera is described in detail herein, a line scanner can be also used to make thermal images that can be used in this process. Line-scan thermal imaging is known to the industry. Other thermal measurement devices may also be employed.

Figure 3:
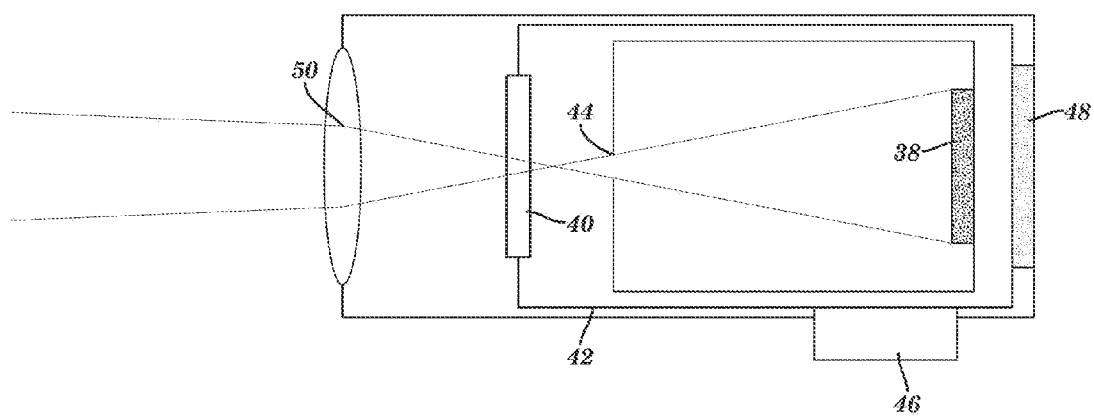
FIG. 3 illustrates basic components of a typical thermal imaging device.

FIG. 3 schematically presents basic components of a cryogenically cooled thermal imaging device, which is an efficient thermal imager for the main thermal sensor 34. Multiple other types of thermal sensors exist and can provide usable thermal imagery or readings. The components shown in FIG. 3 include:

Optics 50 that transmit the image to the sensor cell 38;
A "Cold stop" 40 which serves as a thermal window that insulates the cooled core but let's in the thermal radiation;
Cold casing 42 that insulates the cooled core;
Aperture 44;
Thermal sensor cell 38;
Cryogenic cooling device 46; and
Signal digitizer 48 that digitizes the sensor cell signal.

Operation of a thermal sensor is described hereinafter. Referring again to FIG. 2, the system components may further include optics 50 that allow thermal signal from conductor area to be projected to the sensor cell array. The data may be projected in such a way that one sensor cell array will record thermal information from the center part of the target conductor. An efficient way is to record the information using resolution that allows at least 1 complete pixel to be projected from the center ⅓ of the target conductor width. In typical transmission line, this means approximately ⅓ inch resolution. An example of an optic that might be used is a 500 mm focal length mid-wave infrared optic, with f/4. This kind of optic, matched to the FLIR® SC6700 camera, can be found for example in the FLIR® RS6701 camera package available from FLIR Systems Inc. of 25 Esquire Road, North Billerica, Mass. 01862.

Optionally, the system may contain a spectral filter 52 that allows only a certain wavelength of thermal radiation to enter the sensor cell array [thermal band filter 52]. This filter can be used to minimize the impact of sun reflection from the conductor. Using this kind of filtering is common practice in thermal imaging. A suitable filter can be, for example, 4.50 µm Infrared Longpass Filter, available from Edmund Optics Inc. —101 East Gloucester Pike, Barrington, N.J. 08007-1380 USA. Different bandwidths can be used, depending on camera sensitivity, to utilize bandwidths where sun radiation is lower intensity and where thermal radiation can efficiently pass from the target to the camera through atmosphere.

Optionally, the system may contain another thermal sensor to measure atmospheric temperature, sometimes referred to in this document as a sky sensor 54. The sky sensor 54 can be, for example, a thermal camera operating preferably on the same wavelength as the main thermal sensor, or another sensor capable of determining the relative temperature of the sky (for example, a laser thermometer). An example of a suitable thermal sensor is Jenoptik VarioTherm® LnSb 2-5 um IR camera—with 640×512 pixels for spectral radiometry. This camera is available from IRcameras, 1600 Providence Highway, Walpole, Mass. 02081.

A recording positioning device 56 that allows recording of the main thermal sensor location and, optionally, attitude at time of each sensor image frame capture, may be included in the apparatus. This is used to refer the thermal images to the right coordinates in the spatial reference. The recording positioning device can be, for example, a GPS (Global Positioning System) unit. Alternatively, positioning can be done using the LiDAR sensor's position recording unit. In this case, time stamp of each thermal image frame is recorded. Time stamping allows linking the image to the position recording unit's trajectory data that records the sensor's position and attitude at a given time in a high frequency. Trajectory is often recorded in 1 millisecond intervals.

Computer data storage unit (58) that stores the thermal images, sky sensor readings and positioning device readings. Any known data storage device may be used.

Blackbody object (not shown) that can be used to radiometrically calibrate the sensor optics assembly, as more fully described hereinafter.

Data Processor/Computer (60) and software that runs in this data processor/computer and is used to perform the data manipulation/analysis process described hereinafter. A suitable computer is, for example, a typical PC (Personal Computer) workstation or a laptop computer or mobile workstation computer, equipped with a program to perform the manipulation and analysis. An example of a commercially available laptop is Dell Latitude E6520, equipped with Intel® Core™ i5 2520M 2.50 GHz processor, 4.0 GB, DDR3-1333 MHz SDRAM memory and 320 GB 7200 rpm Hard Drive, available from www.del.com.

Vibration and frequency isolation device (62). The thermal camera can be isolated from the helicopter vibration using suspended mount with some counterweight. The camera can be tightly attached to a counterweight plate that is shaped to balance the center of gravity to the graphical centroid of the camera attachment points. This minimizes the rotational vibration of the camera. Altering the total weight of the camera optics and counterweight package, the nominal frequency of the mounted camera system can be set to differ from the typical main frequencies of the helicopter vibration during thermal measurement. Alternatively, the vibration may be controlled by using motion controlled gyroscopic system. These systems are commercially available and represent known technology.

As an example, an efficient approach is to collect the data from 300-1000 ft AGL (above ground level) altitude with a sensor of 640 measurement cells across the swath. The resolution at conductor level can be for example, ⅓ inch. This yields a swath of 17.8 ft (640*⅓ inch) at conductor level and represents approximately 1.5 degrees FOV (field of view) at the camera, when the collection is done from 700 ft altitude above the conductor.

Figure 4:
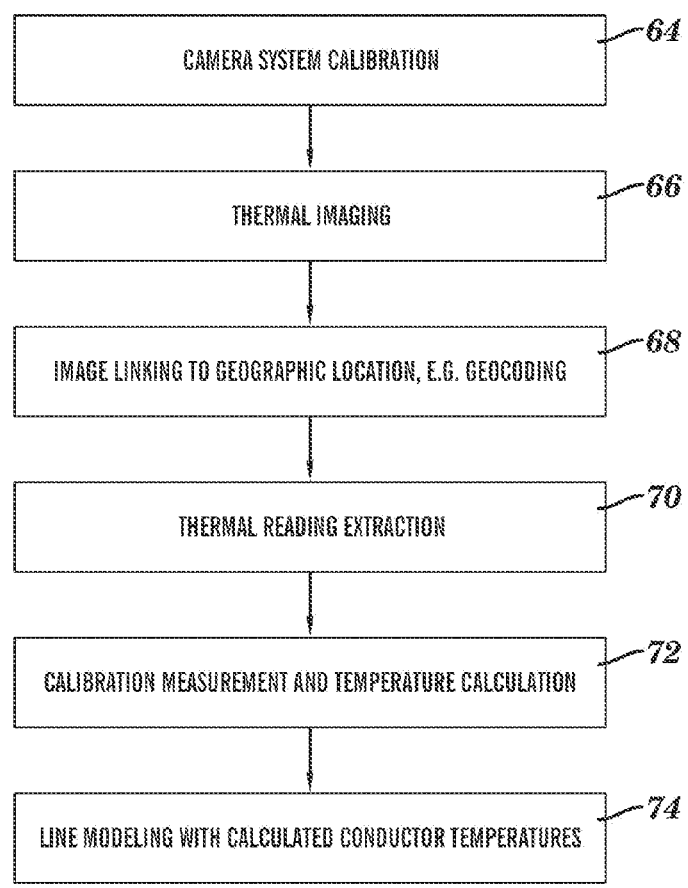
FIG. 4 is a simplified flow chart of steps of the method.

As illustrated in FIG. 4, in a thermal imaging and analysis method, for example, the following steps may be performed:
Camera system calibration 64;
Thermal imaging 66;
Image linking to geographic location 68, e.g. geocoding;
Thermal reading extraction 70;
Calibration measurement and temperature calculation 72; and
Line modeling with calculated conductor temperatures 74.
Each of these steps will now be described.

When performing camera system calibration 64, the thermal camera system may be calibrated to get accurate thermal readings. Thermal camera calibration in radiometric application may account for the variable thickness of the optical material the radiation has to travel through before it reaches a given sensor pixel. Additionally, imperfections in optical material impact individual cell readings. To radiometrically calibrate the sensor optic system a blackbody (reference source used for testing infrared systems) is used. Infrared blackbodies are available from HGH Infrared Systems, One Broadway, 11th Floor, Cambridge, Mass. 02142 USA. The thermal camera system may be pointed to read the blackbody emission at a number of controlled temperatures and a calibration curve is fit to the readings. The calibration curve corrects the thermal reading through each pixel so that they yield true temperature reading from the blackbody in each temperature. The calibration is done so that it covers the expected temperature range of a target conductor, for example 0-100° C. The optical system has to stay in the calibrated position for the calibration to be valid. Any translational and rotational dislocation of the system components requires a new calibration. An efficient approach is to use a camera calibration formula that yields a calibration curve for each pixel.

When performing thermal imaging 66, the system uses a thermal camera to collect thermal images of an overhead conductor. In a LiDAR collection situation, helicopter flying precision allows the sensor path to be kept within a given 50-foot wide corridor. This operating accuracy of the helicopter is called herein "helicopter operating corridor". Because of the desired high resolution, the swath of the thermal camera system may be less than the helicopter operating corridor. The term "swath" is used herein to describe the width of the area at target level that is captured by the thermal sensor on one helicopter pass. The thermal sensor or camera may not always be pointed to target conductors. However, because of the high thermal conductivity of the conductor metal, (e.g., aluminum) and constant line loading in the full circuit, the inventors have found that conductor temperature stays quite constant over multiple spans that are running in same direction. This is why it is sufficient to measure the conductor temperature on the spans where the thermal image frames contain the conductor(s), the background is favorable and the frame quality allows accurate thermal readings.

When the thermal sensor does not point to conductors, the background does not allow accurate readings, or the thermal image frame has any kind of defect that may inhibit accurate thermal reading, the readings are not taken or are discarded. To estimate conductor temperature for the spans between the successful thermal readings, a distance-weighted mean of the closest successful neighboring readings may be used.

The certainty of capturing conductors on the thermal images may be increased by operating the helicopter in a slightly zig-zagging course, crossing the line center frequently.

Then performing image geographic linking or geocoding 68, the thermal images may be tied to proper locations in the spatial reference by attributing the image corner coordinates and image resolution parameters to each image. Image corner or center coordinates are given based on the GPS location of the thermal sensor 34 at time of frame exposure. Image resolution at ground level is calculated from the FOV (Field of View) and sensor altitude AGL at time of exposure.

Alternatively, an orthoimage production process, that is well-known to remote sensing industry, can be used for image orientation. The orthoimage production process is similar to visible band orthoimage production process, and can utilize the LiDAR data and the LiDAR sensor trajectory. To best utilize the LiDAR sensor trajectory, the center optical axis of the thermal camera can be co-aligned with the centermost LiDAR beam.

Alternatively, any other recognition technique can be used to link the acquired conductor temperature readings to corresponding spans or conductors.

The thermal reading extraction 70 process may include the following steps:

1. Select a thermal image frame where the image contains the target conductor and where the background shows colder thermal values than the conductor. For example, low vegetation often provides a relatively stable, cool background. Optional automatic filtering of the thermal images to avoid checking the usability of each thermal image frame is presented below.

2. Select thermal detection window that contains the conductor. In this document, thermal detection window refers to an area, selected from a thermal image frame that is used to determine the conductor temperature. The thermal detection window is selected so that the conductor represents the highest emitted thermal values in the window (Reference FIG. 5). Optionally, the thermal detection window can be shaped as an elongated rectangle aligned with the conductor (reference FIG. 6). An efficient way to select thermal detection window is to use an area where the background contains low vegetation. An efficient way to select thermal detection window is to pre-define the desired detection window size or window width. The user can point the camera towards the conductor location, and the software detects the conductor direction and places the thermal detection window on it. The detection of conductor location can be done by selecting the highest pixel values in the window (number of pixels to select is set so that they cover approximate conductor area in the thermal detection window). Selected pixel centers are turned into a point cloud. A line is fit to the pixel center data using, for example, smallest squares fit. The detection window is placed to align its long main axis with the fitted line. Alternatively, the user can point to two points on the conductor, and the long main axis of the detection window is set to go through the given points. Other ways of pointing to the right location can be used. Sun reflections and potential line hot spots, if seen on thermal image frame, are excluded from the thermal detection window.

3. An efficient way is to define the thermal detection window as a function of the conductor diameter in pixels, and make it an elongated rectangle in conductor direction. For example, if the conductor diameter is 1", the pixel size is ⅓"; the thermal detection window could be 15×60 pixels. This represents a window that is 5 times wider than the conductor and elongated to cover 20 inches of conductor. Such a window is robust to small inaccuracies in thermal detection window rotation errors and cleans out most of the high thermal radiation returns from the background.

Figure 5:
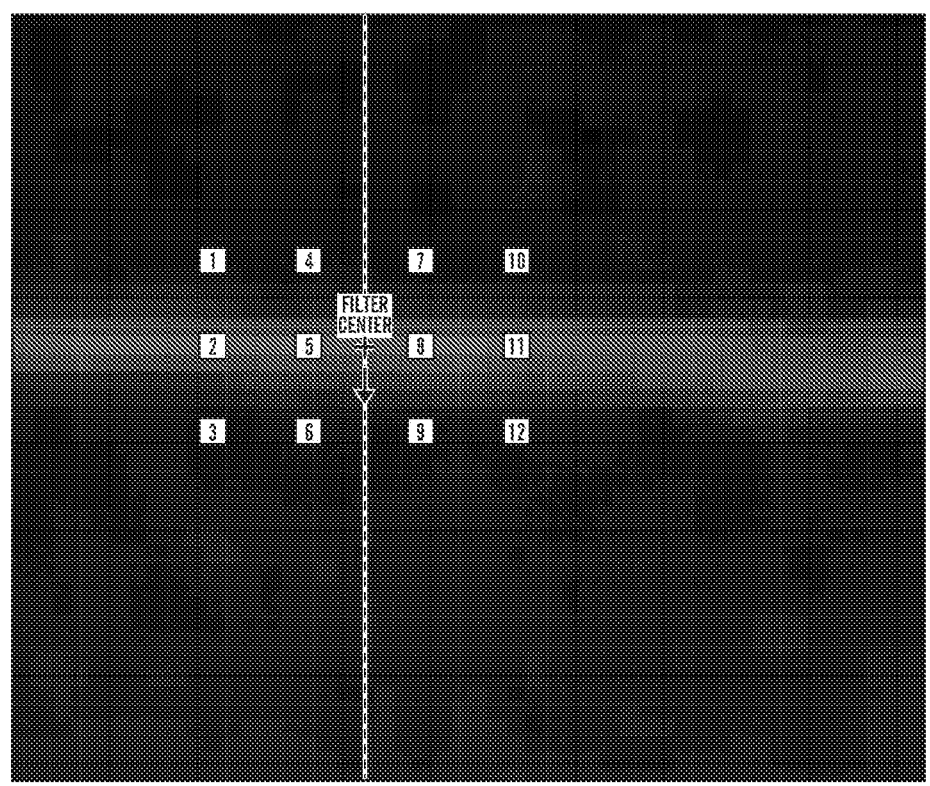
FIG. 5 illustrates operation of a conductor detection filter.
Figure 6:
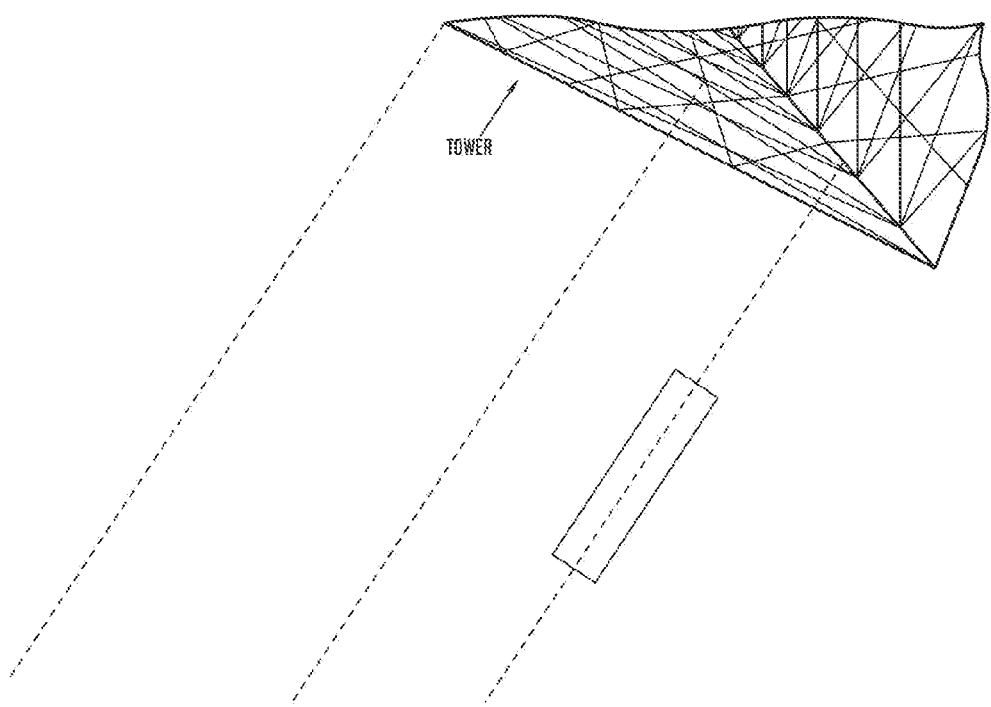
FIG. 6 illustrates a thermal detection window placed on a conductor and turned to follow the conductor direction.

4. In the detection window, the pixels that are in the middle section of the conductor are selected. Since the conductor is the highest emitting object in the thermal detection window, the maximum pixel values represent the best values for conductor temperature determination. The number of pixels to be selected can be given as a function of the thermal detection window size. An efficient number is, for example, one that represents that 5-20% of the visible conductor is in the thermal detection window. FIG. 5 shows the selected highest value pixels on the thermal detection window.

5. A statistic is calculated from the selected pixels to provide $W_{tot}$ to the temperature determination formula described hereinafter. The statistic can be, for example, an average value of all selected pixel values. Alternatively, more sophisticated statistics can be used, like a given percentile of all selected pixel values. Outlier detection can be applied to pixel values before taking statistics.

The thermal reading may be presented to the user in a display, in a digital data or audio transmission, in a report such as a printed or displayed report, or any other suitable method.

As noted above, the system also may perform calibration measurement and temperature calculation 72. The reading in main thermal sensor cell(s) is a function of the following:

$W_{tot}$: total radiation in the pixel(s);
$W_{obj}$: emitted energy from a gray body object, e.g. conductor;
$W_{atm}$: emission from the atmosphere;
$W_{amb}$: reflected emission from ambient sources;
$\tau$: transmittance of the atmosphere; and
$\epsilon$: object's emissivity.

These parameters are related according to the following formula:

$W_{obj}$ can be solved from the above formula:

To calculate $W_{obj}$, the following parameters have to be determined:

$W_{tot}$: This value is provided as an output from thermal reading extraction process.

$W_{amb}$: Can be determined, for example, using a recording temperature gauge station (57) in the helicopter (30) at time of collection. Optionally, this reading can be acquired from ground-based weather stations as well.

$W_{atm}$: Can be determined, for example, using thermal camera that is pointed upward to the sky from collection helicopter.

$\tau$: Is determined as a function of ambient weather conditions that are recorded from weather station on helicopter or on the ground.

$\epsilon$: Emissivity of the conductor. $\epsilon$ depends on the age of the conductor; especially the oxidization of the aluminum surface alters the emissivity. However, in typical line modeling situation, the conductors have been exposed to the atmosphere so long that the oxidization has reached a stable level and the emissivity can be considered constant for a given part of system.

The emissivity can be determined for example by painting small parts of the conductor with matt black paint that will alter emissivity to be approximately 1 (1=close to blackbody). On a utility line, the painting can be done for example from a helicopter that performs a painting operation before the thermal collection. About 3-foot piece of the conductor is painted in each reference spot. A can of spray paint can be attached to a hot stick that allows painting without grounding the helicopter to the same potential with the conductor. Alternatively, the helicopter is grounded to the same potential with the conductor which allows safe painting operation. Thermal readings from the painted conductor and the adjacent non-painted part of conductor can be used to determine the emissivity. The following formula ties the emissivity to the emitted energy from blackbody and gray body:

$$\epsilon = W_{obj}/W_{bb} \quad [3.]$$

To determine emissivity we can assume that the temperatures of the conductor of painted and adjacent non-painted parts are the same. This is a fair assumption because of the high heat conductivity of conductor surface metals (aluminum, turned to aluminum oxide).

Additional verification of the proper temperature reading can be done by placing a thermometer in or on the conductor at the time of collection and by comparing the temperature acquired from the camera system to the temperature of the thermometer.

The emissivity of the conductor is a key variable in determining the conductor temperature with a thermal imaging camera sensor. The emissivity varies depending on conductor age, type, climate and air quality. Empirical data about conductor emissivity in real-life conditions has been published by Rigdon, W. S., House, H. E., Grosh, R. J. and Cottingham, W. B. (1963) "Emissivity of Weathered Conductors after Service in Rural and Industrial Environments". Table 1 below shows the emissivity values Rigdon, W. S. et. al. reported in industrial atmosphere and Table 2 below shows the reported values in rural atmosphere. Noticeably, the emissivity values of all conductors with service age over 1 year was between 0.67 and 0.95. This age class covers almost all conductors in service at the moment. Additionally, as the following example shows, when the emissivity varies within this range, a fairly accurate temperature estimate can be produced just by assuming the emissivity to be, for example, about 0.8.

TABLE 1

| Sample Number | Years Exposed | Emissivity $\epsilon$ (200 F.) | Conductor Size, MCM† or Awg | Voltage, Kv | Geographical Location |
| --- | --- | --- | --- | --- | --- |
| 56-10 | 4 | 0.84 | 795, 26/7 | 120 | Great Lakes |
| 56-14 | 4 | 0.80 | 795, 26/7 | 120 | Great Lakes |
| 56-16 | 4 | 0.80 | 477, 26/7 | 120 | Great Lakes |
| 56-17 | 4 | 0.81 | 477, 26/7 | 120 | Great Lakes |
| 8-CST* | 25 | 0.89 | 266.8, SA | 120 | Great Lakes |
| 57-155 | 1 month | 0.62 | 500, SA-19 | 161 | Southern states |
| 57-160 | 2 month | 0.83 | 500, SA-19 | 161 | Southern states |
| 57-163 | 5 month | 0.93 | 500, SA-19 | 161 | Southern states |
| 58-2 | 8 month | 0.92 | 500, SA-19 | 161 | Southern states |
| 58-40 | 10 month | 0.91 | 500, SA-19 | 161 | Southern states |
| 58-6 | 1 | 0.94 | 500, SA-19 | 161 | Southern states |
| 57-147 | 7 | 0.91 | 636, 26/7 | 161 | Southern states |
| 57-123 | 30 | 0.95 | 4/0, 6/1 | 120 | Southern states |
| 5-CST | 38 | 0.77 | 400, SA-19 | 161 | Southern states |
| 6-CST | 23 | 0.79 | 500, 30/19 | 120 | Northeastern states |

TABLE 1-continued

| Sample Number | Years Exposed | Emissivity ε (200 F.) | Conductor Size, MCM† or Awg | Voltage, Kv | Geographical Location |
|---|---|---|---|---|---|
| 58-7 | 41 | 0.85 | 500, 30/19 | 120 | Northeastern states |
| 57-153 | 2 | 0.90 | 477, 26/7 | 44 | Western states |
| 57-158 | 5½ | 0.80 | 397.5, SA-19 | 120 | Western states |
| 9-CST | 13 | 0.88 | 350, SA-19 | 60 | Western states |

All conductors ACSR or stranded aluminum (SA).
* CST denotes tests by C. S. Taylor at Alcos Research Laboratories, New Kensington, Pa.; other samples tested at Purdue University, Lafayette, Ind.
†Thousand circular mils.

TABLE 2

| Sample Number | Years Exposed | Emissivity ε (200 F.) | Conductor Size, MCM* or Awg | Voltage, Kv | Geographical Location |
|---|---|---|---|---|---|
| 57-154 | 1 month | 0.53 | 500, SA-19 | 161 | Southern states |
| 57-159 | 2 month | 0.54 | 500, SA-19 | 161 | Southern states |
| 57-162 | 5 month | 0.53 | 500, SA-19 | 161 | Southern states |
| 59-1 | 8 month | 0.82 | 500, SA-19 | 161 | Southern states |
| 59-3 | 10 month | 0.73 | 500, SA-19 | 161 | Southern states |
| 59-5 | 1 | 0.71 | 500, SA-19 | 161 | Southern states |
| 57-133 | 13 | 0.95 | 3/0, 6/1 | 66 | Southern states |
| 57-149 | 13 | 0.76 | 477, 26/7 | 161 | Southern states |
| 57-135 | 17 | 0.86 | 3/0, 6/1 | 66 | Southern states |
| 57-118 | 29½ | 0.95 | 500, SA-19 | 161 | Southern states |
| 57-119 | 29½ | 0.85 | 500, SA-19 | 161 | Southern states |
| 57-150 | 40 | 0.87 | 500, 30/19 | 161 | Southern states |
| 57-156 | 5 | 0.67 | 4/0, 6/1 | 138 | Western states |
| 57-157 | 45 | 0.74 | 4/0, SA-7 | 70 | Western states |

All tests run at Purdue University.
All conductors either ACSR or stranded aluminum (SA).
*Thousand circular mils.

Figure 7:
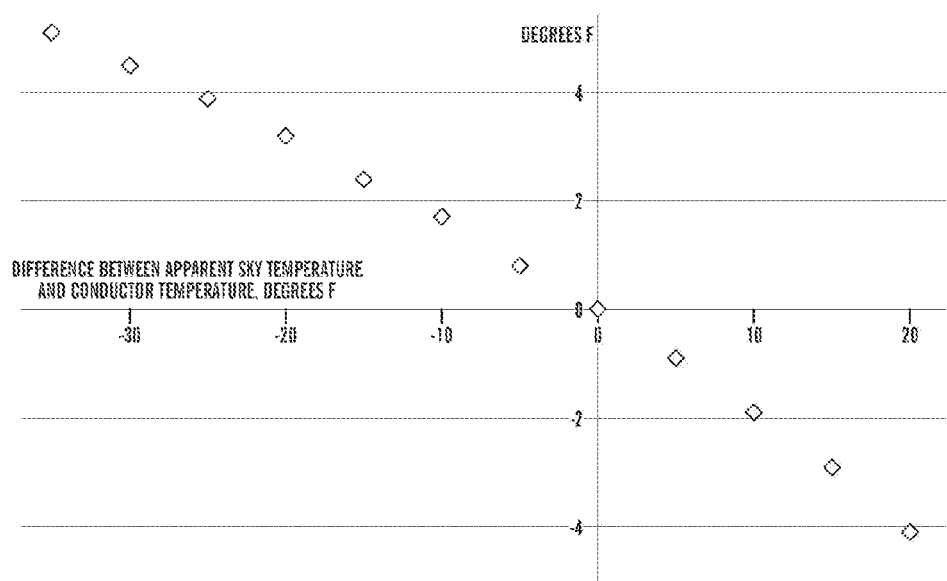
FIG. 7 is a graph illustrating temperature estimation error as a function of difference between sky temperature and conductor temperature.

The following example of imaging conditions illustrate the impact of emissivity determination accuracy to the thermal analysis accuracy: Let us assume the sky temperature is 49° F., the conductor temperature is 54.3° F. and the conductor emissivity is 0.8. However, the emissivity value is determined, as described above, to be 0.7. The thermal reading acquired would report conductor temperature of 55° F. Correspondingly, if emissivity was overestimated to be 0.9, the thermal reading would be measured to be 53.7° F. As a rule of thumb, error of 0.1 in emissivity, if the conductor emissivity is in range that is typical to seasoned conductors and the sky conditions are in a normal range of non-winter daytime conditions, will not cause over 5° F. errors in thermal readings. FIG. 7 presents the temperature measurement error, in Fahrenheit degrees, caused by emissivity determination error. In this figure, the true emissivity of the conductor is 0.8. However, the emissivity of 0.7 is used to calculate the temperature. The error of conductor temperature is presented in degrees ° F. as a function of the difference between sky temperature and true conductor temperature. In typical spring, summer and autumn daytime conditions, the difference between sky temperature and conductor temperature is within −45° F. and +10° F., with sky temperature being typically colder than the conductor. As seen from FIG. 7, this would cause, at maximum, a temperature measurement error of −5° F., if emissivity was estimated 10 percent too low. It is viable to estimate emissivity to 5 percent error using multiple different approaches presented in this document. It is viable to measure the conductor emissivity within 0.05 error, for example, by using reference of high-emissivity paint markers or even a formula that utilizes the conductor age, type, climate and air quality conditions. If actual emissivity measurements are not available, using an averaged emissivity of, for example, 0.82 will provide adequate results in most conditions.

Alternatively, if the emissivity value cannot be measured, a model of emissivity as a function of conductor type, climate, air quality and service age can be used to improve the emissivity determination accuracy. This is done by acquiring emissivity data on the conductors that can be accessed, and fitting a model between conductor type, climate, air quality and service age or other predictors that are available. A non-parametric determination method (nearest neighbor, k-nearest neighbors etc.) can be used as an alternative to fitted regression model.

Line Modeling with Calculated Conductor Temperatures (74).

The line modeling process itself is well-known to the industry and is presented, for example, in the following articles: Hooper, Brian, "Vegetation Management Takes to the Air", Transmission & Distribution World, September 2003; and Hooper, Brian & Bailey, Tom, "Aerial Surveys Calculate Vegetation Growth", Transmission & Distribution World, September 2003. These articles are hereby incorporated by reference herein.

3D CAD modeling of transmission lines can be done using the LiDAR measurements. For example, commercially available PLS-CADD® software package, available from Power Line Systems, 610 N. Whitney Way, Suite 160, Madison, Wis. 53705, can be used to model line conductors with LiDAR data.

Transmission structures, conductor location and conductor attachment points are identified. Structures and conductors are modeled to match the LiDAR. The as observed-conductor location is often modeled by fitting a wire in the model to match the catenaries of LiDAR returns from conductor for each span. Conductor type, diameter, weight and temperature are attributed to the model. The temperature is taken from the above described temperature determination process.

The sun is a very hot body that can cause reflection effects on overhead imaging, even if the reflectivity is relatively low. Optionally, a narrow-band filter can be used to minimize sun reflections.

The filter may be selected to allow passage of radiation in the absorption bands of $CO_2$ or $H_2O$, where the atmosphere cuts down the amount of heat radiation from sun.

Additionally, in thermal image frame selection and in thermal measurement window selection, the conductor areas with high sun reflection are discarded.

Alternatively, to minimize the sun reflection artifacts, the data collection can be done at night or under heavy cloud conditions.

Using narrow field of view, sensor vibration can be a serious problem, especially, when the sensor is mounted on a vibrating vehicle such as a helicopter. There are a few alternative ways to handle this problem with vibration control. An effective solution is to apply all of the vibration control strategies below.
1. Fast exposure time. The sensitivity of thermal cells varies by sensor type. For this application, high sensitivity cells are preferable because they allow short exposure time. The shorter the exposure, the less vibration effect is seen on the image frames. Cooled sensors tend to be more sensitive than non-cooled sensors. An effective solution is to use sensor that allows 3-4 µs exposure.
2. Disregard the data with problematic vibration effect. Typically, vibration of certain frequency follows the pattern where the speed of object motion varies as a function of time and can be expressed with a sine-shaped curve. Vibration can be rotational or translational. Helicopter vibration is a combination of many rotational and translational frequency components. Most harmful for the thermal image frame quality is the vibration 1-10× the exposure time. Typically, the lower is the vibration frequency, the wider is the amplitude. Because of the varying speed of the sensor during the vibration cycle, some thermal image frames have more harmful vibration effect than others. For conductor measurements, not all thermal image frames are needed. There is room to disregard the frames with an excessive vibration effect, which is an effective method of vibration control. Simply, in this process, frames with excessive vibration effect are not used. To automatically filter out the frames with heavy vibration effect a computer program can be used. The program identifies the image sharpness. If image sharpness is below a given threshold, the frame is automatically disregarded. For example, the differences between neighboring pixel values across the flight direction can be used to analyze image sharpness. The bigger is the mean of differences between neighboring pixel values, the sharper the image.
3. The thermal camera can be isolated from the helicopter vibration using a suspended mount with some counterweight. The camera can be tightly attached to a counterweight plate that is shaped to balance the center of gravity to the graphical centroid of the camera attachment points. This minimizes the rotational vibration of the camera. Altering the total weight of the camera- optics- and counterweight package, the nominal frequency of the mounted camera system can be set to differ from the typical main frequencies of the helicopter vibration during thermal collection event.
4. The vibration may be controlled by using motion controlled gyroscopic system. These systems are commercially available and represent known technology.

Motion blur may also be an issue. The helicopter is often moving at 30-60 knots during collection. With typical integration times and desired resolution, the footprint of a pixel moves quite significantly during intergration. For example, 7 ms intergration time and 60 knot speed causes a pixel to move about 21.5 cm. This could cause the pixel to move over the target area so much that the pixel does not represent reduction of any small object. This is called "motion blur". Since the aircraft movement co-aligns with conductor direction, the pixel that is in the conductor center stays on the conductor center and still is able to acquire accurate reading of the conductor. If the helicopter movement deviates from conductor direction, the motion blur prevents measurement. Such frames are easily recognizable as the conductor image is not sharp. The image frames with motion blur are discarded from the analysis.

When discarding of image frames is used as a method of controlling artifacts or areas of no interest, a large amount of imagery needs to be analyzed for usability. Some automatic methods are presented here to select the image frames that contain high quality information from the conductor area.
Vibration Control Using Automatic Discarding of Thermal Image Frames with a Heavy Vibration Effect

| $A_{11}$ | $A_{12}$ | $A_{13}$ | $A_{14}$ | $A_{15}$ | $A_{16}$ |
|---|---|---|---|---|---|
| $A_{21}$ | $A_{22}$ | $A_{23}$ | $A_{24}$ | $A_{25}$ | $A_{26}$ |
| $A_{31}$ | $A_{32}$ | $A_{33}$ | $A_{34}$ | $A_{35}$ | $A_{36}$ |
| $A_{41}$ | $A_{42}$ | $A_{43}$ | $A_{44}$ | $A_{45}$ | $A_{46}$ |
| $A_{51}$ | $A_{52}$ | $A_{53}$ | $A_{54}$ | $A_{..}$ | $A_{..}$ |
| $A_{61}$ | $A_{62}$ | $A_{63}$ | $A_{64}$ | $A_{..}$ | $A_{nm}$ |

The above table represents a 6×6 pixel "thermal image" taken from a helicopter that moved upwards in the image when the image was captured. Assumption is the sensor was in vibrating conditions during the image exposure. Additionally, it was assumed that the most harmful vibration is the one across the flight direction, since the conductor is a long object along the flight direction, and vibration along the flight direction will only cause artifacts that mix the conductor pixel values to each other. To test the vibration effect on this image, the following algorithm can be used:

Image Sharpness Index S is Calculated:

For computational efficiency, the sharpness can be calculated by taking for example a systematic sample of thirty 5×5 masks over the thermal image frame. S is calculated for each mask and sum of the S values over the sample is used.

The algorithm is run for a file folder of image frames. Each image frame is analyzed, and the frames with sharpness above a given threshold are saved to another folder.

Areas with high thermal emission background may be avoided for better thermal reading accuracy. If the background is warmer than the conductor, its emission may tamper the thermal reading from the conductor by scattering to the conductor, pixels in the atmosphere.

High thermal readings can be sorted out with an automatic algorithm. Mean pixel value is calculated for the thermal image frame. If the mean value is higher than a given threshold, the image frame is discarded. The conductors cover such a small area of the image that their heat signature will not alter the mean value of the frame significantly.

For computational efficiency, the background thermal emission level can be calculated by taking, for example, a systematic sample of thirty 5×5 masks over the thermal image frame. The mean is calculated as a mean value of all pixels in all masks. Calculation of image sharpness and high background value can be combined in the same program.

Due to the small footprint and helicopter operation accuracy constraints, only some of the thermal image frames actually have the conductors covered. The purpose of the conductor filter is to automatically find the thermal image frames that feature conductors in the image frame. In the thermal image frames with low thermal background radiation, the conductor typically is among the highest thermal signals. If the conductor causes a heated strip, for example 3 pixels wide across the frame, it can be detected using an automatic pattern matching algorithm. A pattern matching filter of FIG. 5 can be applied, where pixel values in the pixel of the middle strip have to be higher than the pixel values of the side strips.

In the line imaging case, the helicopter heading is known at time of thermal imaging. The filter direction can be set to find conductors in approximate flight direction. In this example, the flight direction is from left to right. The pixel value in pixel 2 is compared to values in pixels 1 and 3. If pixel 2 value is more than a given threshold t higher than values in 1 and 3, it is assigned as "positive". Rows 4 . . . 6, 7 . . . 9 and 10 . . . 12 are assessed the same way. If all rows are positive, the filter center point (identified with a cross) is assigned to contain a conductor. The filter is run from up to down along a given pixel row. Pixel rows are sampled over the whole image frame, taking for example every 20th row into analysis and attributing conductor-containing pixels as "conductor locations". Linear models are fit through all conductor locations found. If any of the linear fits contains more than threshold of F of the found conductor locations in its close proximity P, the thermal image frame is deemed to contain a thermal image of an operating conductor.

When operating the system with multiple widely-spaced conductors, one must consider that the swath of a sensor at conductor level may be about 16-17 ft with 640 pixel sensor array and ⅓ inch resolution. Many transmission line circuits have wider spacing of phases than 12 ft which means all conductors cannot be collected in one pass. This can be addressed by, for example, any of three different solutions:
1. Assuming the loading is the same in all phases of a circuit. This way, only one phase needs to be sensed. In the case of double circuits, where different circuits are attached to the same structures, this approach will not work.
2. Using a sensor cell with higher resolution or a set of multiple sensors running parallel to each other.
3. Moving the swath, during a single pass, so that it alternates the coverage between conductors of interest. This can be done either by the pilot, moving the helicopter path so that the sensor points at different conductors during collection, or if an actively controlled gimbal is used, by the equipment operator, pointing a gimbaled camera towards different conductors during the pass.

The embodiments described above may allow remote thermal measurements of conductor temperature at time of LiDAR data collection and use of such measured conductor temperature, acquired from the direct thermal measurements, for power line clearance analysis. Measured thermal readings allow more accurate temperature information than temperatures modeled from ambient conditions and line loading information.

Spatial accuracy of the temperature information is better than the information that is derived from ambient conditions and line loading. Each span that has a thermal image can have a measured thermal reading. The added spatial accuracy benefits especially line modeling in variable terrain, like mountains, where the line crosses many different elevations, wind channels, and other features that impact small-scale weather. A weather station that is located in horizontal proximity but in different elevation may show different weather conditions.

Additionally, using weather stations, it is difficult to measure the weather conditions on the conductor level. The conductors may experience substantially higher wind than ground level weather station.

The improved accuracy of the conductor temperature measurements is beneficial, especially when maximum operating temperature or line clearances are analyzed. High costs may be incurred to improve or maintain the line rating. Higher measurement precision allows more accurate rating and safe operation of the line at its maximum capacity. This is especially critical today, when many lines operate on the upper end of their maximum capacity, and lines are re-built to increase the rating.

Vegetation management benefits from improved accuracy in conductor sag analysis. Less vegetation needs to be cut if smaller measurement error margins can be applied to ensure safe and reliable operation.

This new thermal line analysis technology provides electric utilities with the methodology to replace the calculated, or estimated temperature of their conductors based on weather conditions and line loading with more precise, actual temperature readings based on thermal measurements of the conductor. The associated decrease in margin of error enables utilities to: improve system reliability and capacity; enhance the security of transmission assets; demonstrate compliance with applicable regulatory requirements; and reduce mitigation costs associated with compliance by as much as $2 billion over a three year period. In recent testing confirmed by Electric Power Research Institute (EPRI) sensors, the accuracy provided by the present invention presented a 95 percent confidence level, with residual error of only 3.75° F.

This invention materially contributes to more efficient utilization and conservation of energy resources. It is the only technology today that can remotely measure transmission line conductor temperature to within 3.5 degrees F. This ability is critical when building LiDAR-based line models, which are the basis of today's transmission line maintenance, design, and capacity and safety analysis. Accurate temperature information provides for grid capacity, which is a critical input for energy efficiency.

The invention also enables enhanced energy conservation by providing more accurate temperature data which will ensure generation and transmission assets are better synchronized to meet demand. It also allows more efficient use of renewable energy, by optimizing transfer capacity from generation to consumers. This invention enables generators to more accurately see the flow of electricity through transmission conductors, thereby making improvements to the grid where it is most urgently needed.

Additionally, the invention supplies utilities with precise data to identify congestion points on the grid. This is a critical input for efficient capital utilization and to enhance reliability. Grid safety and reliability are major issues in the utility industry. The invention has a direct positive impact on power line reliability.

Although specific examples have been described herein, other approaches, apparatus, components and methods may be employed to implement the invention. For example, the thermal sensor may be situated remote, proximate, or in contact with the conductor to provide direct thermal measurements of the conductor substantially simultaneous with acquisition of the 3-dimensional location data.

The invention claimed is:
1. A method of analyzing an overhead electrical conductor, comprising:
by a processor, accessing 3-dimensional location data of an overhead conductor;
by the processor, accessing thermal measurement data of the conductor, wherein the thermal measurement data comprises a remotely collected thermal image wherein each element of the thermal measurement data corresponds an element of the 3-dimensional location data and has a collection time that is substantially simultaneous with a collection time of its corresponding location data element;
by the processor, generating a computer assisted design (CAD) model of the conductor using the 3-dimensional location data of the conductor and the thermal measurement data of the conductor; and by the processor, employing the computer assisted design (CAD) model for thermal analysis of the conductor.

2. The method of claim 1 wherein the remotely collected thermal image comprises a plurality of thermal image frames, and further comprising:
   selecting, for processing, one or more frames of said thermal image frames that contain the conductor, contain a background having lower thermal values than the conductor, and exhibit image quality that allows accurate thermal reading.

3. The method of claim 2, further comprising, by the processor, linking a selected frame to a geographic location.

4. The method of claim 3, further comprising, by the processor, extracting a thermal reading from the geographically linked selected frame.

5. The method of claim 4, further comprising, by the processor, determining emitted energy from the conductor in accordance with the following equation:

$$W_{obj} = \frac{W_{tot} - (1-\varepsilon) \times \tau \times W_{amb} + (1-\tau) \times W_{atm}}{(1-\tau)}$$

wherein
   $W_{obj}$ comprises a measure of energy emitted from the conductor,
   $W_{tot}$ comprises the thermal reading extracted from the geographically linked selected frame and represents total radiation,
   $W_{amb}$ comprises reflected emission from ambient sources,
   $W_{atm}$ comprises emission from an atmosphere,
   $\tau$ comprises transmittance of the atmosphere, and
   $\varepsilon$ comprises emissivity of the conductor.

6. The method of claim 1, further comprising acquiring the thermal measurement data of the conductor substantially simultaneously with collecting the 3-dimensional location data.

7. The method of claim 1, further comprising:
   performing a thermal analysis of the thermal measurement data to determine temperature of the conductor at the time that the 3-dimensional location data was collected;
   wherein said computer assisted design (CAD) model of the conductor is generated using a temperature of the conductor determined by the thermal reading; and
   employing the computer assisted design (CAD) model of the conductor to analyze clearance between the conductor and surroundings of the conductor.

8. The method of claim 7, wherein employing the computer assisted design (CAD) model to analyze clearance comprises conducting at least one of a sway analysis and a sag analysis to determine conductor location in different weather and/or line loading conditions.

9. The method of claim 1, further comprising:
   performing a thermal analysis of the thermal measurement data to determine temperature of the conductor at a time that the 3-dimensional location data was collected;
   wherein said computer assisted design (CAD) model of the conductor is generated using the temperature of the conductor determined by the thermal analysis; and
   employing the computer assisted design (CAD) model of the conductor to determine a thermal rating of a target line that includes the conductor.

10. The method of claim 1, wherein the 3-dimensional location data comprises LiDAR data collected from an airborne vehicle, and said thermal measurement is acquired by the airborne vehicle concurrently with the LiDAR data.

11. A method for determining temperature of an overhead electrical conductor, comprising:
   by a processor, accessing 3-dimensional location data of an overhead conductor;
   accessing thermal measurement data of the conductor, wherein each element of the thermal measurement data corresponds an element of the 3-dimensional location data and has a collection time that is substantially simultaneous with a collection time of its corresponding location data element; and
   performing a thermal analysis of the thermal measurement to determine temperature of the conductor at a time that the 3-dimensional location data was collected.

12. The method of claim 11, further comprising generating a computer assisted design (CAD) model of the conductor using the collected 3-dimensional location data of the conductor and the determined temperature of the conductor.

13. The method of claim 12, further comprising employing the computer assisted design (CAD) model for at least one of: thermal line analysis of the conductor; thermal rating of a power line that includes the conductor; clearance analysis relative to the conductor; and vegetation management relative to the conductor.

14. A system, comprising:
   a processor;
   a computer-readable medium on which is stored location data and thermal measurement data for a plurality of overhead electrical conductors; and
   a non-transitory computer-readable memory containing programming instructions that enable the processor to:
      access 3-dimensional location data of a selected one of the overhead electrical conductors;
      access thermal measurement data for the selected conductor, wherein each element of the thermal measurement data corresponds an element of the 3-dimensional location data and has a collection time that is substantially simultaneous with a collection time of its corresponding location data element; and
      perform a thermal analysis of the thermal measurement to determine temperature of the conductor at a time that the 3-dimensional location data was collected.

15. The system of claim 14, wherein the instructions also enable the processor to generate a computer assisted design (CAD) model of the conductor using the collected 3-dimensional location data of the conductor and the determined temperature of the conductor.

16. The system of claim 15, wherein the instructions also enable the processor to employ the computer assisted design (CAD) model for at least one of: thermal line analysis of the conductor, thermal rating of a power line that includes the conductor, clearance analysis relative to the conductor, and vegetation management relative to the conductor.

17. The system of claim 14 wherein the instructions also enable the processor to:
   access a remotely collected thermal image comprising a plurality of thermal image frames, and further comprising:
   select, for processing, one or more frames of said thermal image frames that contain the conductor, contain a background having lower thermal values than the conductor, and exhibit image quality that allows accurate thermal reading.

18. The system of claim 17, wherein the instructions also enable the processor to:
   link a selected frame to a geographic location, and
   extract a thermal reading from the geographically linked selected frame.

19. The system of claim 18, wherein the instructions also enable the processor to determine emitted energy from the conductor in accordance with the following equation:

$$W_{obj} = \frac{W_{tot} - (1-\varepsilon) \times \tau \times W_{amb} + (1-\tau) \times W_{atm}}{(1-\tau)}$$

wherein $W_{obj}$ comprises a measure of energy emitted from the conductor, $W_{tot}$ comprises the thermal reading extracted from the geographically linked selected frame and represents total radiation, $W_{amb}$ comprises reflected emission from ambient sources, $W_{atm}$ comprises emission from an atmosphere, $\tau$ comprises transmittance of the atmosphere, and $\varepsilon$ comprises emissivity of the conductor.

20. A method of analyzing an overhead electrical conductor, comprising:

by a processor, accessing 3-dimensional location data of an overhead conductor;

by the processor, accessing thermal measurement data of the conductor, wherein the thermal measurement data comprises a remotely collected thermal image, wherein each element of the thermal measurement data corresponds an element of the 3-dimensional location data and has a collection time that is substantially simultaneous with a collection time of its corresponding location data element;

by the processor, generating a computer assisted design (CAD) model of the conductor using the 3-dimensional location data of the conductor and the thermal measurement data of the conductor.

21. The method of claim 20, further comprising by the processor, the computer assisted design (CAD) model is employed for thermal analysis of the conductor.

* * * * *